(12) United States Patent
Schirmer

(10) Patent No.: US 10,229,225 B2
(45) Date of Patent: Mar. 12, 2019

(54) METHOD AND DEVICE FOR DETERMINING GROUPS OF GEOLOGICAL FACIES

(71) Applicant: TOTAL SA, Courbevoie (FR)

(72) Inventor: Patrice Schirmer, Pau (FR)

(73) Assignee: TOTAL SA, Courbevoie (FR)

( * ) Notice: Subject to any disclaimer, the term of this patent is extended or adjusted under 35 U.S.C. 154(b) by 380 days.

(21) Appl. No.: 15/029,524

(22) PCT Filed: Aug. 27, 2014

(86) PCT No.: PCT/FR2014/052133
§ 371 (c)(1),
(2) Date: Apr. 14, 2016

(87) PCT Pub. No.: WO2015/055905
PCT Pub. Date: Apr. 23, 2015

(65) Prior Publication Data
US 2016/0267202 A1    Sep. 15, 2016

(30) Foreign Application Priority Data
Oct. 14, 2013    (FR) ...................................... 13 59959

(51) Int. Cl.
*G01V 99/00*    (2009.01)
*G06F 17/50*    (2006.01)

(52) U.S. Cl.
CPC ............ *G06F 17/50* (2013.01); *G01V 99/005* (2013.01)

(58) Field of Classification Search
CPC .............................. G06F 17/50; G01V 99/005
USPC ........................................................... 703/2
See application file for complete search history.

(56) References Cited

U.S. PATENT DOCUMENTS

2012/0150501 A1*    6/2012    Wu ...................... G01V 99/005
                                                                    703/2
2013/0262051 A1*    10/2013    Plost ...................... G01V 11/00
                                                                    703/2

FOREIGN PATENT DOCUMENTS

FR    1 257 649    2/1961

OTHER PUBLICATIONS

International Search Report and Written Opinion for PCT/FR2014/052133, dated Oct. 31, 2014, 11 pages.
English translation of International Search Report PCT/FR2014/052133, dated Oct. 31, 2014, 2 pages.

* cited by examiner

*Primary Examiner* — Saif A Alhija
(74) *Attorney, Agent, or Firm* — Patterson Thuente Pedersen, P.A.

(57) ABSTRACT

This invention relates to a method comprising a determination of a first group of facies as a function of the local values of proportion of the groups of facies for each mesh cell of the model. If said first group is among the first set of groups, the neighboring mesh cells are the current virgin mesh cells neighboring the set of connected mesh cells, otherwise they are the current virgin mesh cells neighboring mesh cells associated with a group. A second group is determined for each neighboring mesh cell as a function of the local values of proportion of the groups of facies for said current virgin mesh cell and if the second determined group of facies corresponds to the first group of facies, identification of said current virgin mesh cell as a candidate mesh cell.

9 Claims, 10 Drawing Sheets

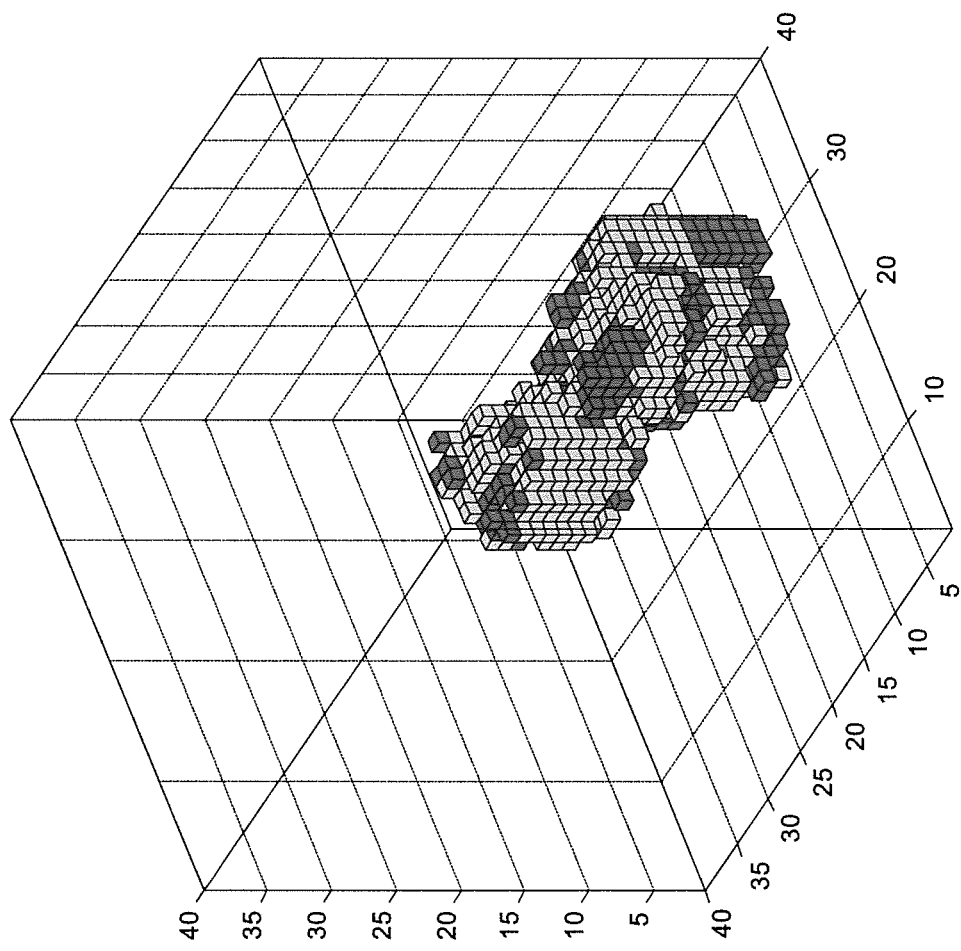

METHOD AND DEVICE FOR DETERMINING GROUPS OF GEOLOGICAL FACIES

RELATED APPLICATIONS

The present application is a National Phase entry of PCT Application No. PCT/FR2014/052133, filed Aug. 27, 2014, which claims priority from FR Patent Application No. 13 59959, filed Oct. 14, 2013, said applications being hereby incorporated by reference herein in their entirety.

FIELD OF THE INVENTION

This invention relates to the field of determining geological representations, and in particular the field of determining representations of hydrocarbon reserves under constraints.

BACKGROUND OF THE INVENTION

In order to adequately determine the reserves of gas or hydrocarbons contained in a reservoir, it is useful to establish grids (or meshed models for example) of reservoirs, for example based on 3D seismic interpretation of the underground or based on geological knowledge of drilling or operating wells.

These models must be determined in order to represent the actual underground containing the reservoir as truly as possible.

In the oil industry, a test well can make it possible to better understand the characteristics of the reservoir wherein the hydrocarbons are trapped. Most often, a test well comprises the opening ("draw down" phase) and/or the closing ("build up" phase) of the well in question: the variations in flow and pressure over time are then recorded.

One of the objectives of a test well can be to determine the capacity of the reservoir for the production of hydrocarbons, such as oil or natural gas.

Another objective of such a test can be descriptive, i.e. make it possible to determine the geometries and certain characteristics of the reservoir (i.e. permeability of the rock, presence of limits, connectivity of the wells between them, etc.).

"Dynamic modelling stresses" refers to all of the information determined using these test wells (e.g. volume connected to the well, presence of limits in the reservoir and associated distance(s), flow property of the fluids to the well, permeability of the rock, connectivity etc.).

In order to satisfy the dynamic modelling stresses, reservoir engineers or geologists most often determine a large number of "candidate" models using known methodologies (as, for example, the one described in patent application FR1257649, for determining channels) then eliminate the models that do not satisfy these dynamic stresses (with possibly a given tolerance margin): this approach can be considered as an a posteriori (or empirical) approach.

However, such methods are not free of defects.

Indeed, only a small number of models (bearing a possible share of randomness) systematically satisfy the dynamic stresses.

As such, the full calculation of the models which in the end will be set aside can consume calculation resources and substantially slow down the determination of a suitable model.

In addition, this approach can be complex in particular in order to verify certain dynamic stresses such as the "non-connectivity" between two wells as the combinatorics can be excessively complicated.

There is therefore a need to take the dynamic stresses into account as far upstream as possible when determining the geological model in order to optimise the calculation resources. In addition, this taking into account can make it possible to improve the pertinence and the reliability of the geological models determined.

This invention as such improves the situation.

SUMMARY OF THE INVENTION

This invention proposes to improve the determination of groups of facies in geological models by taking into account in particular certain dynamic stresses a priori by proposing an iterative method for determining groups of facies while avoiding "steps backward".

This invention thus relates to a method for determining groups of geological facies among facies of a first set of groups of facies and of a second set of groups of facies in a meshed geological model.

The geological model comprises at least:
a set of virgin mesh cells;
a set of connected mesh cells, the mesh cells of the set of connected mesh cells are associated with a group of facies among the first set of groups of facies.

Each mesh cell of the model is associated with a local value of proportion for each facies of the first set of groups of facies and of the second set of groups of facies;

The method comprises:

/a/ determination of a first group of facies among groups of facies of the first set of groups of facies and of the second set of groups of facies as a function of the local values of proportion of the groups of facies for each mesh cell of the model;

/b1/ if said first group of facies is a group of facies among the first set of groups of facies, for each current virgin mesh cell neighbouring the set of connected mesh cells, determination of a second group of facies among groups of facies of the first set of groups of facies and of the second set of groups of facies as a function of the local values of proportion of the groups of facies for said current virgin mesh cell and if the second determined group of facies corresponds to the first group of facies, identification of said current virgin mesh cell as a candidate mesh cell;

/b2/ if said first group of facies is a group of facies among the second set of groups of facies, for each current virgin mesh cell neighbouring mesh cells associated with a group of facies, determination of a second group of facies among groups of facies of the first set of groups of facies and of the second set of groups of facies as a function of the local values of proportion of the groups of facies for said current virgin mesh cell and if the second determined group of facies corresponds to the first group of facies, identification of said current virgin mesh cell as a candidate mesh cell;

/c/ association of said first group of facies with a virgin mesh cell selected from among the candidate mesh cells.

A group of facies can comprise one or several facies. This group of facies can also be according to architectural elements or sedimentary body. Each group of facies can correspond to sedimentation patterns. These groups are most often determined by geologists upstream of the method described hereinabove and can be an input of the latter.

The first set of groups of facies can comprise groups of facies having a common characteristic such as good connectivity (i.e. permeability). This first set can be empty.

The second set of groups of facies can comprise the groups of facies of the model that are not in the first set. This second set can also be empty.

The denomination "virgin mesh cell" is arbitrary. Any other denomination is also possible. By default, the virgin mesh cells are the mesh cells that are not yet definitively associated with a group of facies.

The denomination "connected mesh cell" is arbitrary. Any other denomination is also possible. The connected mesh cells can be the mesh cells definitively associated with a group of facies considered by a geologist as "connectable" (i.e. allowing for a connection or a communication) due to their intrinsic permeability. As such, the connected mesh cells are the mesh cells associated with a group of facies of said first set.

The model can comprise other sets of mesh cells such as a set of "non-connected" mesh cells. This set can group together the mesh cells not present in one of the preceding sets and/or the mesh cells definitively associated with a group of facies considered by a geologist as not "connectable".

The determination of a first group of facies can be carried out stochastically according to the global proportions of the facies in the model. The global proportions can be an average over the set of mesh cells of the local proportions of the facies (coming for example from received proportion cubes).

A current virgin mesh cell "neighbouring" another mesh cell is for example a virgin mesh cell sharing an edge, a face or a point with this other mesh cell.

The "identification of a current virgin mesh cell as a candidate mesh cell" can comprise the adding of this virgin mesh cell to a list of possible candidates, the adding of a flag to this virgin mesh cell in order to facilitate the future identification thereof, the changing of the name of the mesh cell, or any other similar method.

Advantageously, the method can further comprise:

/d/ if the first group of facies is a group of facies among the first set of groups of facies, reiteration of the steps /a/ to /c/ of the method by adding the selected virgin mesh cell to the set of connected mesh cells and by suppressing the selected virgin mesh cell in the set of virgin mesh cells;

/e/ otherwise, reiteration of the steps /a/ to /c/ of the method by suppressing the selected virgin mesh cell in the set of virgin mesh cells.

The first set comprises groups of facies that have been identified beforehand by an operator (e.g. a geologist). This identification can comprise the appreciation of the connectable (or non-connectable) nature of the facies as described hereinabove.

In the step /e/, it is also possible, in addition, to add the selected virgin mesh cell to the set of "non-connected" or "supplement" mesh cells if this set exists.

In an embodiment, with each mesh cell of the model able to be associated with a mesh cell volume, the method can further comprise:

/f/ stoppage of the reiteration when a sum of the volumes of mesh cells associated with the mesh cells of the set of connected mesh cells is greater than, or greater than or equal, to a target volume value.

The target volume value can be a value set by an operator but also it can be determined using a stochastic drawing in a distribution of probability of a target volume.

As each mesh cell of the model can be associated with a mesh cell volume, the method can further comprise:

/f/ stoppage of the reiteration when a sum of the volumes of mesh cells associated with mesh cells of the set of connected mesh cells of which a distance to a reference mesh cell is less than, or less than or equal, to a predetermined distance is greater than or greater than or equal to a target volume value.

Indeed, in certain hypotheses, geologists can determine the volume connected to a well only to a certain distance referred to as "investigation distance". As such, in this particular embodiment, the predetermined distance is the investigation distance and the reference mesh cell is a mesh cell of the well in the model.

In a particular embodiment of the invention, the method can further comprise:

/g/ suppression of each virgin mesh cell neighbouring the set of connected mesh cells in the set of virgin mesh cells.

This suppression can make it possible to isolate the determined connectable volume (i.e. formed by the connectable mesh cells) and to prevent a later simulation from increasing it by connecting new connectible mesh cells to the already-determined connectable volume.

Of course, it is also possible to add, as a supplement, each virgin mesh cell neighbouring the set of connected mesh cells to a set of "non-connected" mesh cells or "supplemental" mesh cells As the model can further comprise at least one target variogram according to at least one direction in said model, the selection of the virgin mesh cell among the candidate mesh cells can comprise:

for each current candidate mesh cell among the candidate mesh cells,
calculation of at least one variogram associated with said current candidate mesh cell, with the calculation of said at least one variogram being carried out according to the at least one direction of the target variogram and using mesh cells of the model that have an associated group of facies and of said candidate mesh cell associated with the first group of facies;
determination of a variogram difference associated with said current candidate mesh cell between said at least one calculated variogram and said at least one target variogram;
selection of a virgin mesh cell, the selected virgin mesh cell being the mesh cell associated with the lowest variogram different among the determined variogram differences.

For example, the target variogram can be a variogram according to the vertical axis or $\vec{z}$ axis of the model. This variogram can also be a variogram according to several axes of the model such as the $\vec{x}$ and $\vec{y}$ axes.

The variogram calculated for a given mesh cell is the variogram of the mesh cells having an associated group of facies, while considering temporarily, that the candidate mesh cell is associated with the first determined group of facies. This variogram may not take the virgin mesh cells into account.

As the model can further comprise at least one target distribution of distances according to at least one direction in said model between two mesh cells of said model, the selection of the virgin mesh cell among the candidate mesh cells can comprise:

for each current candidate mesh cell among the candidate mesh cells,
calculation of at least one distribution of distances between pairs of mesh cells, with the distance being calculated according to the at least one direction of the target distribution, with the calculation of said at least one distribution being carried out for mesh cells of the model that have an associated group of facies;

determination of a difference in distribution associated with said current candidate mesh cell between said at least one calculated distribution and said at least one target distribution;

selection of a virgin mesh cell, the selected virgin mesh cell able to be the mesh cell associated with the lowest distribution difference among the determined distribution differences.

The distance according to a direction between two mesh cells is the length of the projection of the segment of which the ends are these two mesh cells over this direction. The distance according to two directions (non-parallel) between two mesh cells is the length of the projection of the segment of which the ends are these two mesh cells on the plane formed by these two directions. The distance according to three directions (thus forming a marker in three dimensions) between two mesh cells is a distance between these two points in the 3D space.

The distance can be a Euclidian distance or any other distance in the mathematical sense.

The distribution difference associated with said current candidate mesh cell can comprise a standardisation of the calculated distribution and of the target distribution by dividing these distributions by the number of distances that made it possible to construct them and this so as to allow for a suitable comparison.

This invention also relates to a device intended for determining groups of geological facies among a set of groups of facies in a meshed geological model.

The geological model comprises at least:
a set of virgin mesh cells;
a set of connected mesh cells.

Each mesh cell of the model being associated with a local value of proportion for each facies in the set of groups of facies, the device comprises:

a circuit for determining a first group of facies among the set of groups of facies as a function of the local values of proportion of the groups of facies for each mesh cell of the model;

a circuit for determining, for each current virgin mesh cell neighbouring the set of connected mesh cells, a second group of facies among the set of groups of facies as a function of the local values of proportion of the groups of facies for said current virgin mesh cell and if the second determined group of facies corresponds to the first group of facies, identification of said current virgin mesh cell as a candidate mesh cell;

a circuit for associating said first group of facies with a virgin mesh cell selected from among the candidate mesh cells.

A computer programme, implementing all or a portion of the method described hereinabove, installed on pre-existing equipment, is in itself advantageous, when it makes it possible to determine a group of facies in a geological model.

As such, this invention also relates to a computer programme comprising instructions for implementing the method described hereinabove, when this programme is executed by a processor.

This programme can use any programming language (for example, an object language or other), and be in the form of a source code that can be interpreted, a partially compiled code or code that is entirely compiled.

FIG. 8 described in detail hereinafter, can form the flowchart of the general algorithm of such a computer programme.

BRIEF DESCRIPTION OF THE DRAWINGS

Other characteristics and advantages of the invention shall appear when reading the following description. The latter is purely for the purposes of illustration and must be read with regards to the annexed drawings wherein:

FIG. 7 shows a second possible result of the method described in an embodiment of the invention;

DETAILED DESCRIPTION OF THE DRAWINGS

Figure 1:
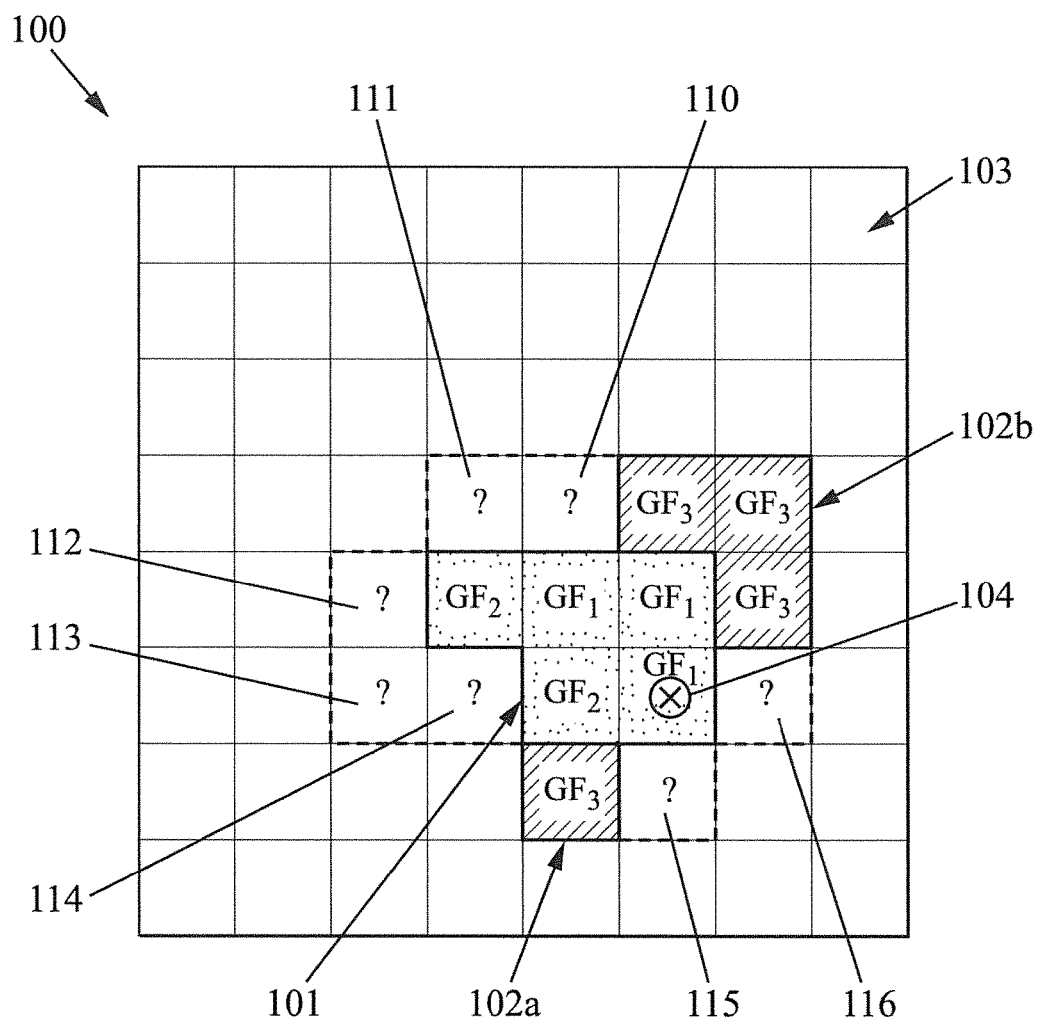
FIG. 1 shows a representation of a geological model in an embodiment of the invention.

FIG. 1 shows a representation of a geological model in an embodiment of the invention.

In this embodiment, the model is a model 100 with two dimensions (i.e. 2D model). Of course, this description can be generalised to a situation wherein the model has three dimensions.

The model 100 comprises a set of mesh cells 101 referred to as "connected mesh cells". Each mesh cell of this set is associated with a group of facies (i.e. $GF_1$ or $GF_2$) considered as having good connectivity: for example, these groups of facies can include porous and/or permeable rock (e.g. sands).

For example, $GF_1$ can represent a group of facies having very good connectivity while $GF_2$ can represent a group of facies having simply good connectivity.

These groups can have been pre-identified by an operator upstream (i.e. identification of groups of facies considered as "connectable" in opposition to groups of facies considered as "non-connectable").

Moreover, the model 100 comprises sets of mesh cells 102a and 102b referred to as "non-connected mesh cells" or "supplement mesh cells". Each mesh cell of these sets 102a and 102b is associated with a group of facies (i.e. $GF_3$) considered as having poor conductivity: for example, these groups of facies can comprise argillaceous rocks.

Of course, other groups of facies can also have poor conductivity in a particular embodiment.

The remaining mesh cells of the model 100 are the mesh cells that are not associated with a group of facies (such as mesh cell 103) and are called "virgin mesh cells".

Among the connected mesh cells 101, the mesh cell 104 has the particularity of representing the position of a well in the geological model considered: this mesh cell is also referred to as "reference mesh cell".

Furthermore, it is possible to identify virgin mesh cells neighbouring the set of mesh cells 101. These mesh cells are the mesh cells of the set of virgin mesh cells and having at least one edge (respectively, face for a 3D model) that is common with a mesh cell of the set of mesh cells 101. It is also possible, in another embodiment, to define that these mesh cells are the mesh cells of the set of virgin mesh cells and having at least one common point (or angle) with a mesh cell of the set of mesh cells 101.

In the hypothesis wherein the first group of facies (see FIGS. 2a to 2d hereinbelow for the drawing of this first group) is a mesh cell group in the set formed by the group of facies $GF_1$ and $GF_2$, the neighbouring virgin mesh are, in this embodiment, the mesh cells 110 to 116.

Figure 2A:
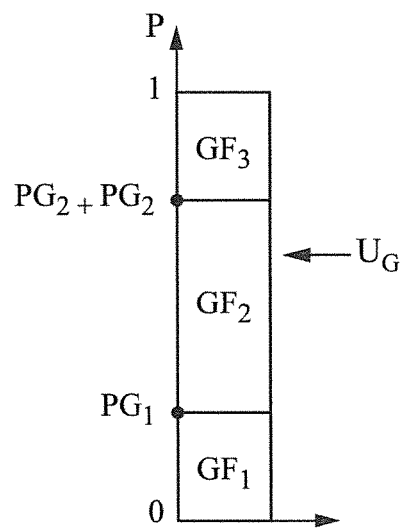
FIG. 2a shows a random drawing of a group of facies in an embodiment according to the invention and thanks to target global proportions of facies in the model.

FIG. 2a shows a random drawing of a first group of facies in an embodiment according to the invention and thanks to target global proportions of facies in the model.

The target global proportions of the model of the different groups of facies can be calculated, for example, using proportion cubes of the model.

Each proportion cube is associated with a group of facies and represents the proportions of this group for each mesh cell of the model (i.e. the local values of proportion). The proportion cubes normally add up to 1 for a mesh cell with coordinates (i,j) of the model (respectively (i,j,k) in 3D).

As such, it is possible to determine a global value of proportion of each facies by taking an average of the local values of proportion of each proportion cube.

If the global value of proportion of the group of facies 1 is $PG_1$ and the global value of proportion of the group of facies 2 is $PG_2$, it is possible to represent the global values of proportion according to the stacked diagram of FIG. 2a.

In order to determine a group of facies among the set of groups of facies ($GF_1$, $GF_2$, $GF_3$), it is possible to randomly "draw" a number $U_G$ in an interval having as limits 0 and 1:
 if $U_G$ is between 0 and $PG_1$, the first group of facies $GF_1$ is selected;
 if $U_G$ is between $PG_1$ and $PG_1+PG_2$, the first group of facies $GF_2$ is selected;
 otherwise the first group of facies $GF_3$ is selected.

Of course, this embodiment can be generalised to any number of groups of facies.

Figure 2B:
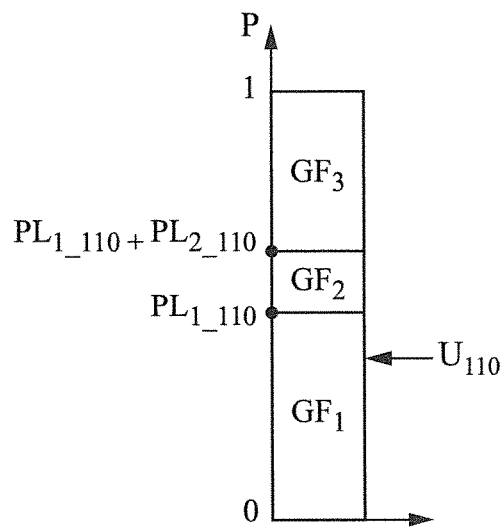
FIGS. 2b to 2d show three random drawings of groups of facies in an embodiment according to the invention and thanks to target local proportions of facies for a considered mesh cell of the model.

FIG. 2b shows a random drawing of groups of facies in an embodiment according to the invention and thanks to target local proportions of facies for the mesh cell 110 of FIG. 1.

As indicated hereinabove, the local values of proportion of the mesh cell 110 can be determined using proportion cubes associated with the model 100.

If the local value of proportion of the group of facies 1 for the mesh cell 110 is $PL_{1\_110}$ and the local value of proportion of the group of facies 2 is $PL_{2\_110}$, it is possible to represent the local values of proportion according to the stacked diagram of FIG. 2b.

In order to determine a group of facies among the set of groups of facies ($GF_1$, $GF_2$, $GF_3$), it is possible to randomly "draw" a figure $U_{110}$ in an interval having as limits 0 and 1:
 if $U_{110}$ is between 0 and $PL_{1\_110}$, the group of facies $GF_1$ is selected;
 if $U_{110}$ is between $PL_{1\_110}$ and $PL_{1\_110}+PL_{2\_110}$, the group of facies $GF_2$ is selected;
 otherwise the group of facies $GF_3$ is selected.

Of course, this embodiment can be generalised to any number of groups of facies.

Figure 2C:
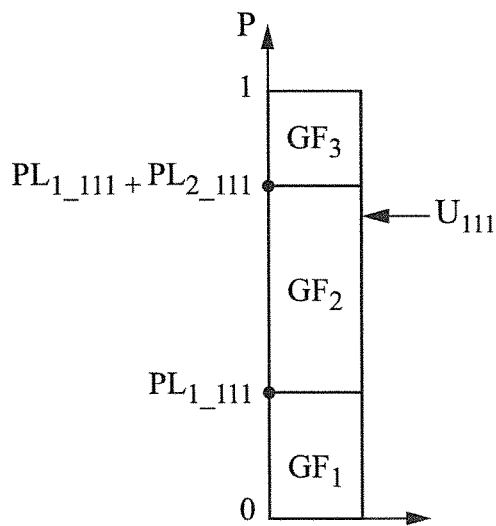

FIG. 2c shows a drawing of groups of facies in an embodiment according to the invention and thanks to target local proportions of facies for the mesh cell 111 of FIG. 1.

As indicated hereinabove, the local values of proportion of the mesh cell 111 can be determined using proportion cubes associated with the model 100.

It is also possible to temporarily modify the local values of proportion in order to reset to zero (or to a value close to zero) the proportions of groups of facies identified as connectable (with the non-connectable proportions of facies then being consequently increased). This modification can, for example, be carried out for the close mesh cells (i.e. less than a certain distance of exclusion) of a mesh cell of the model assumed not connected to the related set during determination. The distance of exclusion can be according to the target variogram of the model: for example, the distance of exclusion can also be equal to one or two times the scope of the variogram.

If the local value of proportion of the group of facies 1 for the mesh cell 111 is $PL_{1\_111}$ and the local value of proportion of the group of facies 2 is $PL_{2\_111}$, it is possible to represent the local values of proportion according to the stacked diagram of FIG. 2b.

In order to determine a group of facies among the set of groups of facies ($GF_1$, $GF_2$, $GF_3$), it is possible to randomly "draw" a figure $U_{111}$ in an interval having as limits 0 and 1:
 if $U_{111}$ is between 0 and $PL_{1\_111}$, the group of facies $GF_1$ is selected;
 if $U_{111}$ is between $PL_{1\_111}$ and $PL_{1\_111}+PL_{2\_111}$, the group of facies $GF_2$ is selected;
 otherwise the group of facies $GF_3$ is selected.

Of course, this embodiment can be generalised to any number of groups of facies.

Figure 2D:
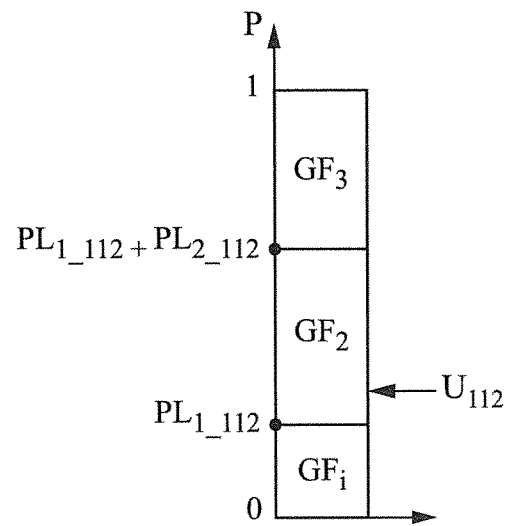

FIG. 2d shows a drawing of second groups of facies in an embodiment according to the invention and thanks to target local proportions of facies for the mesh cell 112 of FIG. 1.

As indicated hereinabove, the local values of proportion of the mesh cell 112 can be determined using proportion cubes associated with the model 100.

If the local value of proportion of the group of facies 1 for the mesh cell 112 is $PL_{1\_112}$ and the local value of proportion of the group of facies 2 is $PL_{2\_112}$, it is possible to represent the local values of proportion according to the stacked diagram of FIG. 2b.

In order to determine a group of facies among the set of groups of facies ($GF_1$, $GF_2$, $GF_3$), it is possible to randomly "draw" a figure $U_{112}$ in an interval having as limits 0 and 1:
  if $U_{112}$ is between 0 and $PL_{1\_112}$, the group of facies $GF_1$ is selected;
  if $U_{112}$ is between $PL_{1\_112}$ and $PL_{1\_112}+PL_{2\_112}$, the group of facies $GF_2$ is selected;
  otherwise the group of facies $GF_3$ is selected.

Of course, this embodiment can be generalised to any number of groups of facies.

Figure 3A:
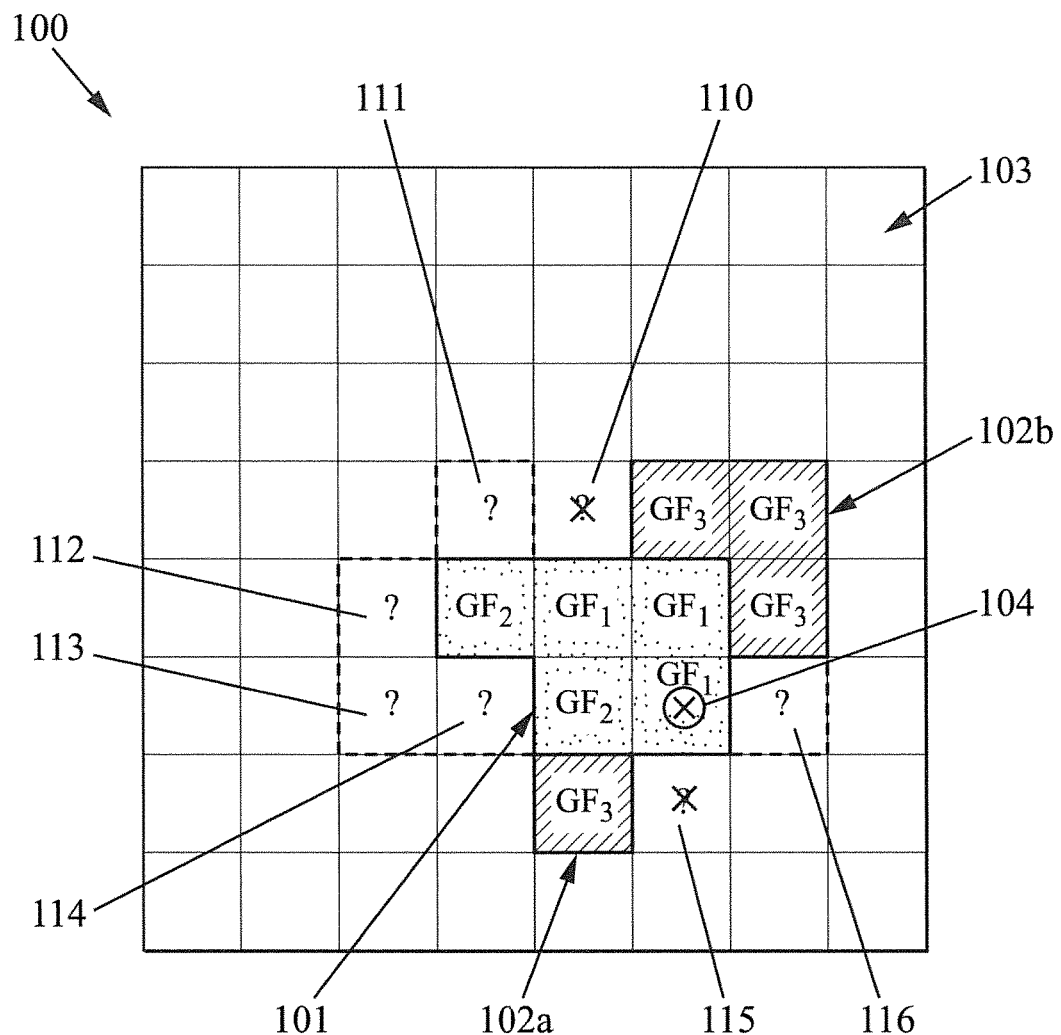
FIG. 3a shows the identification of candidate mesh cells in a geological model and in an embodiment of the invention.

FIG. 3a shows the identification of candidate mesh cells in a 2D geological model and in an embodiment of the invention.

In this embodiment, it is assumed that:
  the group of facies selected according to the global values of proportion is $GF_2$ (see FIG. 2a);
  the group of facies selected according to the global values of proportion for the mesh cell 110 is $GF_1$ (see FIG. 2b);
  the group of facies selected according to the global values of proportion for the mesh cells 111 to 114 is $GF_2$ (see FIGS. 2c and 2d for the mesh cells 111 and 112);
  the group of facies selected according to the global values of proportion for the mesh cell 115 is $GF_3$;
  the group of facies selected according to the global values of proportion for the mesh cell 116 is $GF_2$.

As such, as the group of facies selected for the mesh cells 110 and 115 (i.e. respectively $GF_1$ and $GF_3$) does not correspond to the group of facies selected according to the global values of proportion (i.e. $GF_2$), these mesh cells are not considered as candidate mesh cells.

The other neighbouring virgin mesh cells (i.e. 111 to 114 and 116) are then identified as being candidate mesh cells.

Figure 3B:
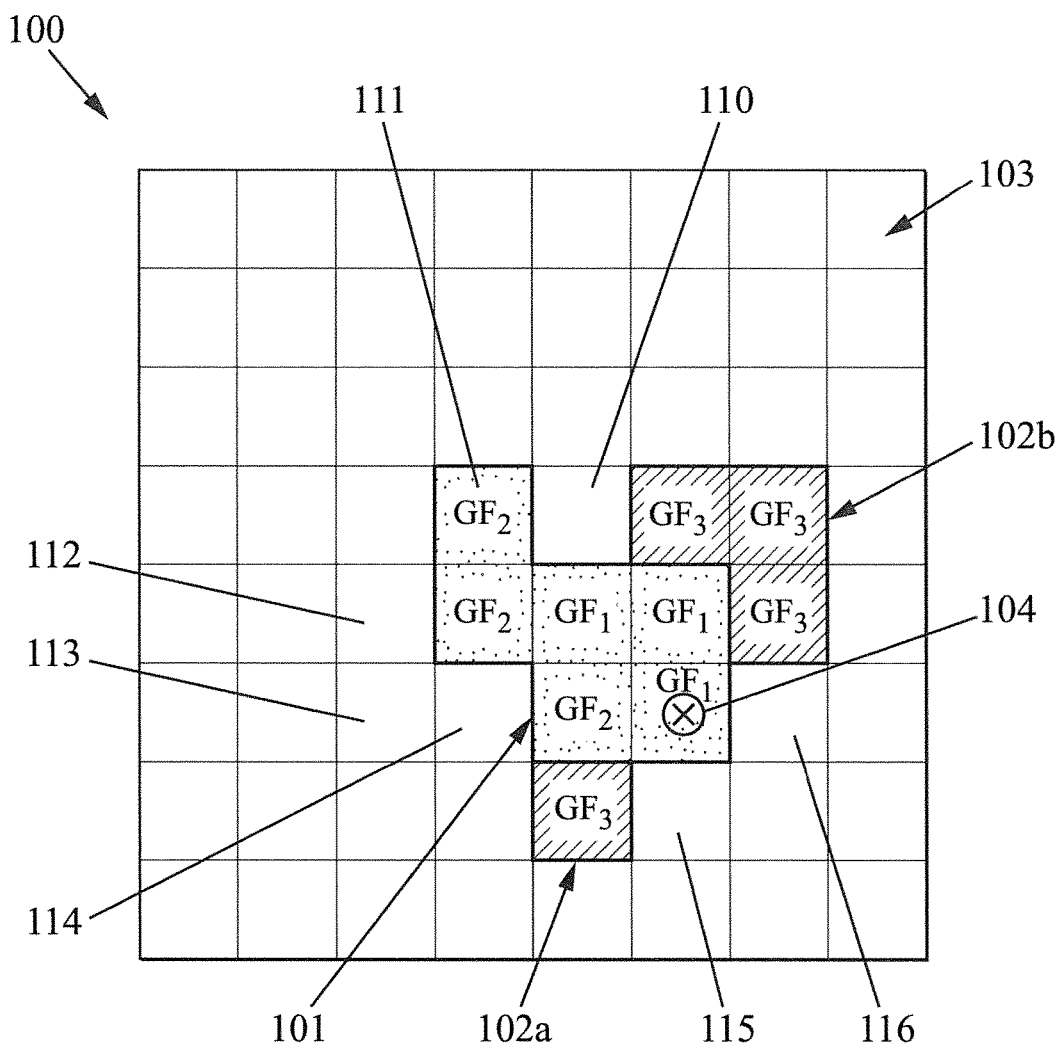
FIG. 3b shows the assigning of a group of facies to a mesh cell in a geological model and in an embodiment of the invention.

FIG. 3b shows the assigning of a group of facies to a mesh cell in a geological model and in an embodiment of the invention.

As described hereinabove in relation with FIG. 3a, the mesh cells 111 to 114 and 116 are candidate mesh cells and $GF_2$ is the group of facies selected according to the global values of proportion.

As such, it is possible to assign the group of facies $GF_2$ to one of the candidate mesh cells so that the target global proportions of the groups of facies are complied with in the model.

This selection can, for example, be stochastic (e.g. equiprobable random drawing for each candidate mesh cell).

However, it is also possible to carry out this selection differently in order to satisfy trend conditions (directional stochastic drawing according to the position of the candidate mesh cells) and any other method of selection. Another method of selection based on the optimisation of variograms and/or on the optimisation of the distribution of distances between two mesh cells is presented hereinafter.

If the chosen process of selection selects the mesh cell 111, this mesh cell 111 is the associated with the group of facies GF2. In addition, it is possible to add this mesh cell 111 to the group of connectable mesh cells 101. This mesh cell 111 is then suppressed of virgin mesh cells since a group of facies is associated with it.

If the group of facies selected according to the global values of proportion was $GF_3$ (a group of facies considered as "non-connectable"), then the mesh cell 111 would have been added to the set of "non-connectable" mush cells similarly to set F102a or 102b.

Figure 4B:
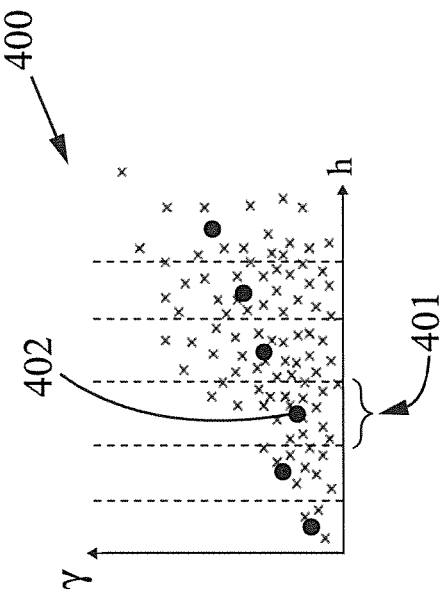
FIG. 4b shows the calculation of a variogram using a variographic cloud in an embodiment of the invention.
Figure 4A:
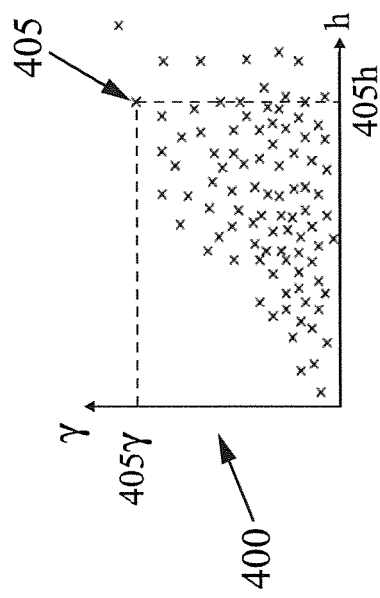
FIG. 4a shows a variographic cloud in an embodiment of the invention.

FIG. 4a shows a variographic cloud 400 in an embodiment of the invention.

The variographic cloud 400 is here a cloud of data points expressing their variability γ according to their inter-distances h.

As such, the point 405 of this variographic cloud represents the variance 405γ of the values of the facies groups of two mesh cells of the model located at a distance 405h. It is also possible to carry out this variogram not using two unique mesh cells but using two mesh cell windows each comprising a plurality of mesh cells. Each group of facies can be associated with a numerical value making it possible to calculate a variance.

In order to obtain a variogram, it is possible to break down the space of the distances (i.e. the abscissa) into a plurality of intervals (such as the interval 401 of FIG. 4b) and to take an average (e.g. 402) of the values of the variance of the points contained in each interval (e.g. 401).

Once the experimental variogram 403 of the model and the theoretical variogram 404 are calculated (or received), it is possible to compare them by calculating for example a difference between these two variograms.

This difference can be calculated by adding, for example, the absolute value of the differences of the variances for two points of the variograms that have the same abscissa: the difference between the point 406 and the point 407 of abscissa i is $\Delta\gamma_i$. The sum can be a simple sum or a weighted sum (with a weight as a function of h, for example). In addition, it is possible to limit the sum to the points of lower abscissa (or less than or equal) to R or 2R. R is called the "scope of the variogram" or "practical scope", i.e. the distance starting from which the variogram remains in an interval of 5% around its level $\gamma(+\infty)$. Of course, in practice this latter interval can be set to another value.

The sum calculated can be called "variogram difference".

Figure 5:
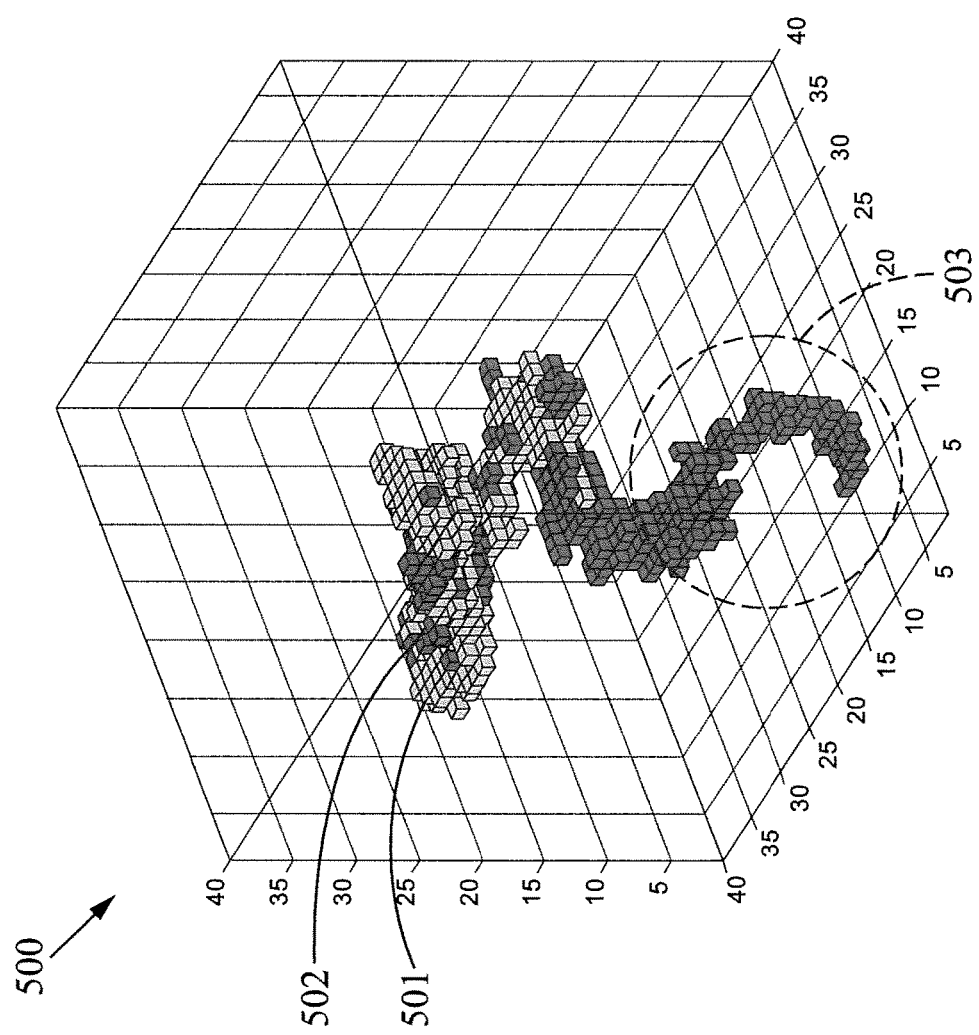
FIG. 5 shows a first possible result of the method described in an embodiment of the invention.

FIG. 5 shows a first possible result of the method described in an embodiment of the invention in a three-dimensional model.

This model 500 is comprised of "connectable" mesh cells such as the mesh cell 501 and "non-connectable" mesh cells such as 502.

However, if the variogram, the local proportions and the global proportions are complied with by this calculated model, certain undesirable forms can appear in certain particular situations (e.g. the form 503).

As such, it is possible to improve the method for determining groups of facies by improving the distribution of the distances between pairs of mesh cells.

Figure 6A:
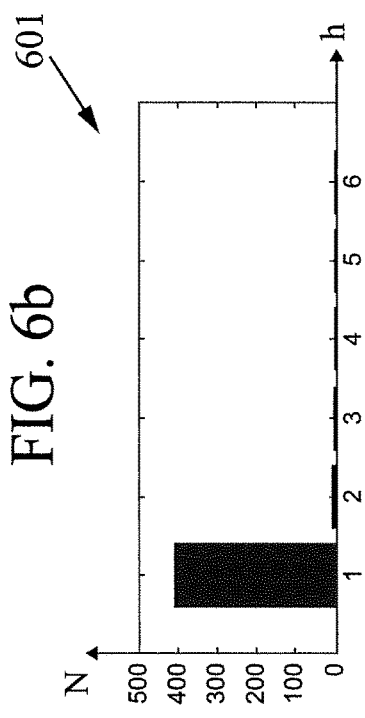
FIG. 6a shows a theoretical or target histogram of distribution of the distances between pairs of points in an embodiment of the invention.

FIG. 6a shows a theoretical or "target" histogram 600 of the distribution of the distances between pairs of mesh cells in an embodiment of the invention and according to one of the axes of the space of the model (here $\vec{z}$).

The calculation of such a histogram 600 can be done in many ways.

For example, knowing the theoretical variographic cloud (see FIG. 4b), it can be possible to count the number of points of this cloud by interval (e.g. the interval 401).

Figure 6B:
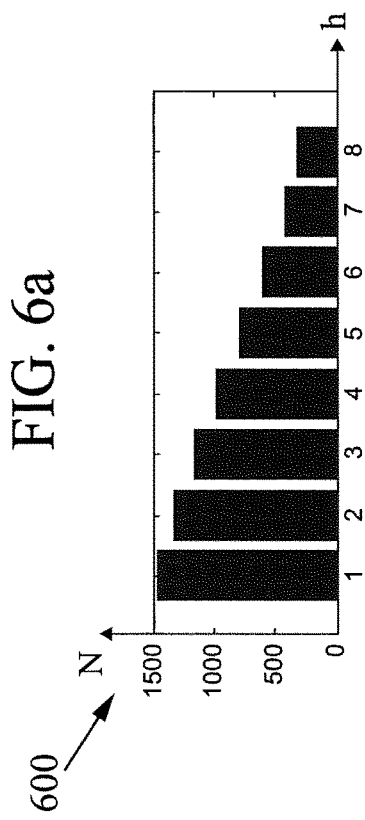
FIG. 6b shows an experimental histogram of the distribution of the distances between pairs of points in an embodiment of the invention.
Figure 6C:
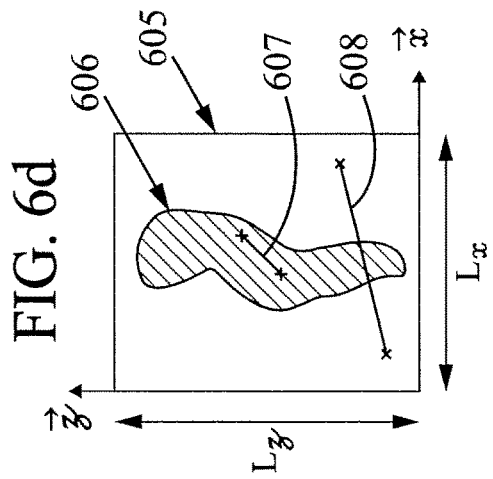
FIG. 6c shows a calculation of a theoretical histogram of the distribution of the distances between pairs of points in an embodiment of the invention.

In addition, it can be possible to determine, for a given rectangle 602 of FIG. 6c (or a rectangle parallelepiped for a 3D case), the distribution of the length according to an axis of the segments (e.g. 603 or 604) or included in an interval of given length according to this axis.

The length of a segment (respectively distance between two mesh cells) according to an axis can be the length of a projection (for example, orthogonal) of this segment (respectively distance between the projection of the two points) on this axis.

Advantageously, it is also possible to determine a target distribution according to an axis using the dimensions of a rectangle. For example, the target distribution according to the $\vec{z}$ axis is, for each h, $L_x(L_z-h)$ in a case with two dimensions or $L_x L_y(L_z-h)$ for a case with three dimensions (with $L_z$ the length of the rectangle or rectangle parallelepiped according to the $\vec{z}$ axis, $L_x$ the length of the rectangle or rectangle parallelepiped according to the $\vec{x}$ axis and $L_y$ the length of the rectangle parallelepiped according to the $\vec{y}$ axis).

Of course, it is possible to establish other histograms representing the theoretical distribution of the distance between pairs of mesh cells according to another axis of the space or even according to all of the directions of the space of the model.

A "standardised" theoretical histogram can also be calculated by dividing the values of the theoretical histogram by the sum of its values (i.e. by the total number of mesh cells): this standardised theoretical histogram is called "standardised theoretical distribution of the distances between pairs of mesh cells".

FIG. 6b shows an "experimental" histogram of the distribution of the distances between pairs of mesh cells in an embodiment of the invention.

Such a histogram 601 represents the distribution, in the same related component, of the distances according to the axis $\vec{z}$ axis between pairs of mesh cells having a group of facies associated in the model.

Figure 6D:
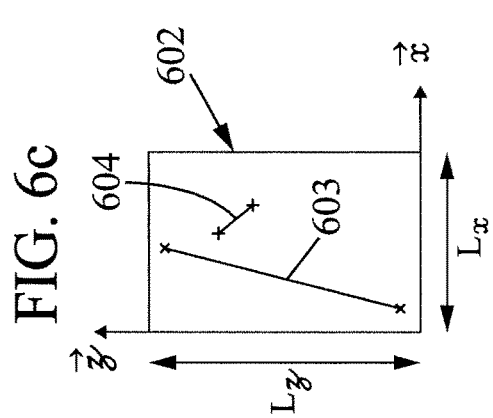
FIG. 6d shows a calculation of an experimental histogram of the distribution of the distances between pairs of points in an embodiment of the invention.

As such, the segments taken into account in this calculation are the segments of the rectangle 605 (having for example the same dimensions as the rectangle 602) of FIG. 6d and of which the two ends are in the related set 606, each one of the mesh cells of this set is associated with a group of facies ("connectable" or "non-connectable"). For example, the segment 607 is taken into account for the construction of the histogram 601 while the segment 608 is not taken into account for this construction.

A standardised experimental histogram can also be calculated by dividing the values of the experimental histogram 601 by the sum of its values: this standardised experimental histogram is called "standardised experimental distribution of the distances between pairs of mesh cells".

In order to evaluate a difference between the two standardised histograms (i.e. standardised experimental histogram and standardised theoretical histogram), it is possible to add the absolute values of the differences between the values of the standardised histogram for each value of abscissa of the latter.

This sum can be simple or weighted (for example, according to the distance h of the two points).

FIG. 7 shows a second possible result of the method described in an embodiment of the invention.

The model shown in FIG. 7 comes from a method for determining groups of facies according to an embodiment of the invention seeking to minimise the difference between the standardised experimental histogram and the standardised target histogram.

As such, the mesh cell selected among the candidate mesh cells is the one that minimises the difference between the new standardised histogram and the standardised target histogram.

Moreover, it is possible to seek to minimise several factors (such as the difference between the new standardised histogram and the target standardised histogram and the difference between the target variogram and the experimental variogram). In this hypothesis, it is possible to add these various factors in order to seek to minimise this latter sum. This latter sum can be simple or weighted for example according to the choice of an operator and his desire whether or not to favour one of the factors at play.

Figure 8:
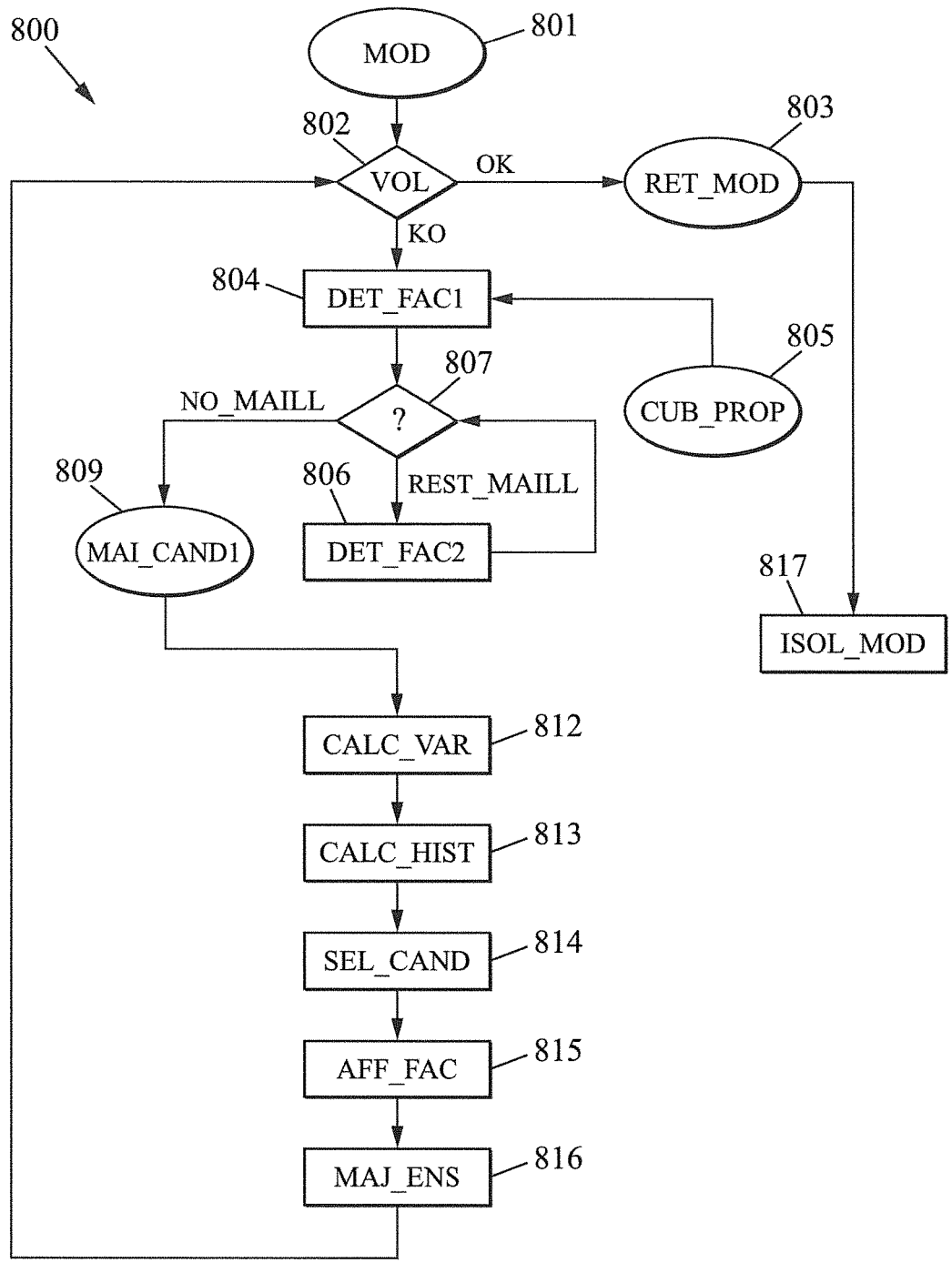
FIG. 8 shows a flowchart of a method in an embodiment of the invention.

FIG. 8 shows a flowchart in an embodiment of the invention.

When the model 801 is received, it is possible to determine if this model is empty (i.e. if all of the mesh cells are virgin) or if this model is partially filled (i.e. if certain mesh cells are associated with groups of facies).

Indeed, it is possible that the groups of facies associated with certain mesh cells are known or are imposed as input constraints. This situation can in particular arise:
  if certain mesh cells represent zones of the model wherein the geological composition is known (e.g. the mesh cells along a drilling well);
  if it is desired that two mesh cells (e.g. two wells) of the model be connected, it is useful to associate with the mesh cells along a trajectory passing through these two wells a group of facies referred to as "connectable" in order to provide this dynamic stress.

The method described hereinbelow thus uses as "germs" the "connectable" mesh cells of the model. If these "connectable" mesh cells form a plurality of related components, it is possible to apply the method described hereinbelow iteratively to each one of these related components.

If the sum (simple or weighted, for example) of the volumes of mesh cells associated with the mesh cells associated with a group of facies referred to as "connectable" (or "connected mesh cells") is greater than a target volume value (test 802, output OK), then the model is returned as is (803).

The sum can be limited to the mesh cells of which a distance to a reference mesh cell is less than a predetermined distance. Indeed, this reference mesh cell can represent a well in the model. The distance can then be the investigation distance that is proper to the test wells carried out on the well (or any other distance defined by an operator/geologist).

In the opposite case (output 802, output KO), a first group of facies is determined (step 804) among the set of groups of facies of the model according to the global values of proportion of the facies (e.g. 70% sand, 30% clay on the average in the entire model). These global values of proportion can be determined using proportion cubes 805 associated with the model 801 received.

In this step, it is possible to initialise a set of candidate mesh cells with the empty set.

If the first group of facies is a group of facies considered as connected, it is possible to select the current virgin mesh cells neighbouring the set of connected mesh cells.

If the first group of facies is a group of facies not considered as connected, it is possible to select the current virgin mesh cells neighbouring mesh cells associated with a group of facies.

For each current mesh cell selected hereinabove, a second group of facies is determined (step 806) as a function of the local values of proportion of the groups of facies for said current virgin mesh cell. If the second determined group of facies corresponds to the first group of facies, it is possible to add the current mesh cell selected to the set of candidate mesh cells.

As long as there are current virgin mesh cells neighbouring the set of connected mesh cells not yet processed (test 807, test REST_MAILL), the latter determination is carried out.

Otherwise (test 807, test NO_MAILL), it is possible to associate (step 815) the first group of facies with a virgin mesh cell selected (step 814) among these candidate mesh cells 809.

In order to select the candidate mesh, it is possible to carry out a simple random drawing among the candidate mesh cells 809.

Figure 4C:
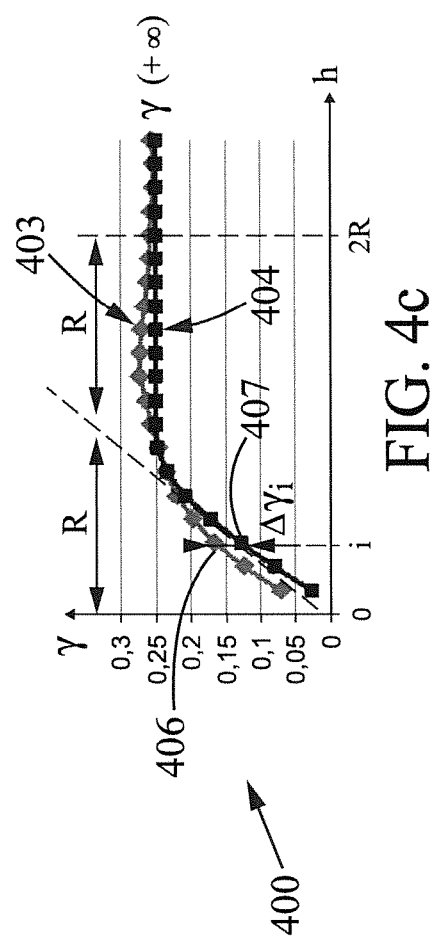
FIG. 4c shows the calculation of a difference between a variogram and a target variogram in an embodiment of the invention.

However, it is also possible to determine, for each candidate mesh cell, the difference between the variogram of the model and a target variogram (step 812) as described in relation with FIGS. 4a to 4c.

It is also possible to determine (as a supplement or alternatively), for each candidate mesh cell, the difference between the histogram of the model and a target histogram (step 813) as described in relation with FIGS. 6a to 6d.

Thanks to these different calculations, it is then possible to select (step 814) the best candidate mesh cell by minimising a global difference according to the two preceding differences calculated (for example, with the global difference being the simple or weighted sum of the two preceding differences).

Once the first group of facies has been associated (step 815) with the selected candidate mesh cell, it is then possible (step 816) to add the selected virgin mesh cell to the set of mesh cells referred to as "connected" if the first group of facies is a group of facies identified beforehand by an operator (e.g. the groups of facies having good connectivity, permeability).

Then, this selected candidate mesh cell is suppressed from the virgin mesh cells since it is associated with a group of facies.

Finally the steps and tests 807 to 816 are reiterated.

Relating to the returned model 803, it is useful to prevent the volume of connected mesh cells from being "increased" by a later simulation which would modify the values of the values of facies of virgin mesh cells. As such, in order to isolate these mesh cells, it is possible to suppress (step 817) each virgin mesh cell neighbouring the set of connected mesh cells in the set of virgin mesh cells.

Following this isolation, it is possible to supplement the model using a known algorithm in order to associate a group of facies with each remaining virgin mesh cell.

Most often, it is possible, using this supplemented model, to determine, for each mesh cell, a facies in the associated group of facies and by architectural element applied to this model.

Figure 9:
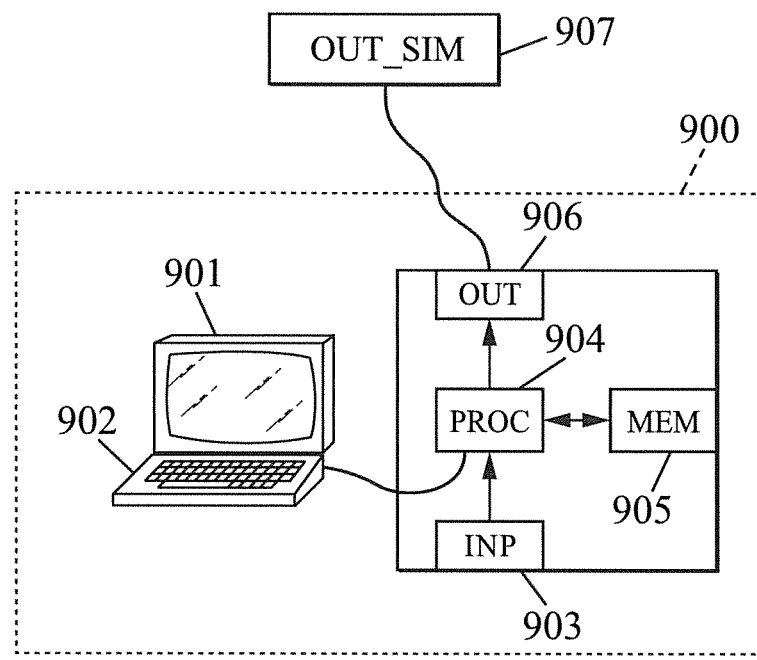
FIG. 9 shows an example of a device for determining groups of geological facies in an embodiment of the invention.

FIG. 9 shows an example of a device for determining groups of geological facies in an embodiment of the invention.

In this embodiment, the device comprises a computer 900, comprising a memory 905 for storing instructions allowing for the implementation of the method, the measurement data received, and temporary data for carrying out the various steps of the method such as described hereinabove.

The computer further comprises a circuit 904. This circuit can be, for example:
- a processor able to interpret instructions in the form of a computer programme, or
- an electronic board of which the steps of the method of the invention are described in the silicon, or
- a programmable electronic chip such as a FPGA ("Field-Programmable Gate Array") chip.

This computer comprises input interface 903 for the receiving of geologic input models and/or proportion cubes associated with this model, and an output interface 906 for the supply of supplemented geologic models for a possible submission in other tools such as flow simulation tools 907.

Finally, the computer can comprise, in order to allow for easy interaction with a user, a screen 901 and a keyboard 902. Of course, the keyboard is optional, in particular in the framework of a computer having the form of a touch-sensitive tablet, for example.

Moreover, the block diagram shown in FIG. 8 is a typical example of a programme of which certain instructions can be carried out with the equipment described. As such, FIG. 8 can correspond to the flow chart of the general algorithm of a computer programme in the sense of the invention.

Of course, this invention is not limited to the embodiments described hereinabove by way of examples; it extends to other alternatives.

Other embodiments are possible.

For example, all of the embodiments presented in 2D can also be generalised and are applicable in situations wherein the model is 3D.

In addition, the calculations of the histogram of FIGS. 6a and 6b are carried out within a rectangle or a rectangle parallelepiped. However, these calculations can be carried out within the complete model or, more generally, in any sub-portion of the model, with this sub-portion able to be of any form whatsoever.

The embodiments above are intended to be illustrative and not limiting. Additional embodiments may be within the claims. Although the present invention has been described with reference to particular embodiments, workers skilled in the art will recognize that changes may be made in form and detail without departing from the spirit and scope of the invention.

Various modifications to the invention may be apparent to one of skill in the art upon reading this disclosure. For example, persons of ordinary skill in the relevant art will recognize that the various features described for the different embodiments of the invention can be suitably combined, un-combined, and re-combined with other features, alone, or in different combinations, within the spirit of the invention. Likewise, the various features described above should all be regarded as example embodiments, rather than limitations to the scope or spirit of the invention. Therefore, the above is not contemplated to limit the scope of the present invention.

The invention claimed is:

1. A method for determining groups of geological facies among a first set of groups of facies and a second set of groups of facies in a meshed geological model, with the geological model comprising:
   a set of virgin mesh cells;
   a set of connected mesh cells, the connected mesh cells are associated with a group of facies among the first set of groups of facies;
   each mesh cell of the model being associated with a local value of proportion for each facies of the first set of groups of facies and of the second set of groups of facies;
   wherein the method comprises:
   /a/ determining a first group of facies among groups of facies of the first set of groups of facies and of the second set of groups of facies as a function of the local values of proportion of the groups of facies for each mesh cell of the model;
   /b1/ if said first group of facies is a group of facies among the first set of groups of facies, for each current virgin mesh cell neighbouring the set of connected mesh cells, determining a second group of facies among groups of facies of the first set of groups of facies and of the second set of groups of facies as a function of the local values of proportion of the groups of facies for said current virgin mesh cell and if the second determined group of facies corresponds to the first group of facies, identifying said current virgin mesh cell as a candidate mesh cell;

/b2/ if said first group of facies is a group of facies among the second set of groups of facies, for each current virgin mesh cell neighbouring mesh cells associated with a group of facies, determining a second group of facies among groups of facies of the first set of groups of facies and of the second set of groups of facies as a function of the local values of proportion of the groups of facies for said current virgin mesh cell and if the second determined group of facies corresponds to the first group of facies, identifying said current virgin mesh cell as a candidate mesh cell;

/c/ associating said first group of facies with a virgin mesh cell selected among the candidate mesh cells; and representing in a display a hydrocarbon reserve in the geological model based on said associating.

2. The method according to claim 1, wherein the method further comprises:
/d/ if the first group of facies is a group of facies among the first set of groups of facies, reiterating steps /a/ to /c/ of the method by adding the selected virgin mesh cell to the set of connected mesh cells and by suppressing the selected virgin mesh cell in the set of virgin mesh cells;
/e/ otherwise, reiterating steps /a/ to /c/ of the method by suppressing the selected virgin mesh cell in the set of virgin mesh cells.

3. The method according to claim 2, wherein, each mesh cell of the model being associated with a mesh cell volume, the method further comprises:
/f/ stopping the reiteration when a sum of the volumes of mesh cells associated with the mesh cells of the set of connected mesh cells is greater than or greater than or equal to a target volume value.

4. The method according to claim 2, wherein, each mesh cell of the model being associated with a mesh cell volume, the method further comprises:
/f/ stopping the reiteration when a sum of the volumes of mesh cells associated with mesh cells of the set of connected mesh cells of which the distance to a reference mesh cell is less than a predetermined distance is greater than or greater than or equal to a target volume value.

5. The method according to claim 2, wherein the method further comprises:
/g/ suppressing each virgin mesh cell neighbouring the set of connected mesh cells in the set of virgin mesh cells.

6. The method according to claim 2, wherein, with the model comprising at least one target variogram according to at least one direction in said model, the selection of the virgin mesh cell among the candidate mesh cells comprises:
for each current candidate mesh cell among the candidate mesh cells,
calculating at least one variogram associated with said current candidate mesh cell, with the calculation of said at least one variogram being carried out according to the at least one direction of the target variogram and using mesh cells of the model that have an associated group of facies and of said candidate mesh cell associated with the first group of facies;
determining a variogram difference associated with said current candidate mesh cell between said at least one calculated variogram and said at least one target variogram;

selecting a virgin mesh cell, the selected virgin mesh cell being the mesh cell associated with the lowest variogram different among the determined variogram differences.

7. The method according to claim 2, wherein, with the model further comprising a target distribution of distances according to at least one direction in said model between two mesh cells of said model, the selection of the virgin mesh cell among the candidate mesh cells comprises:
for each current candidate mesh cell among the candidate mesh cells,
calculating at least one distribution of distances between pairs of mesh cells, with the distance being calculated according to the at least one direction of the target distribution, with the calculation of said at least one distribution being carried out for mesh cells of the model that have an associated group of facies;
determining a difference in distribution associated with said current candidate mesh cell between said at least one calculated distribution and said at least one target distribution;
selecting a virgin mesh cell, the selected virgin mesh cell being the mesh cell associated with the lowest distribution difference among the determined distribution differences.

8. A device for determining groups of geological facies among a first set of groups of facies and a second set of groups of facies in a meshed geological model, with the geological model comprising:
a set of virgin mesh cells;
a set of connected mesh cells, the mesh cells of the set of connected mesh cells are associated with a group of facies among the first set of groups of facies;
each mesh cell of the model being associated with a local value of proportion for each facies of the first set of groups of facies and of the second set of groups of facies;
wherein the device comprises a processor for executing:
a circuit for determining a first group of facies among groups of facies of the first set of groups of facies and of the second set of groups of facies as a function of the local values of proportion of the groups of facies for each mesh cell of the model;
a circuit for, if said first group of facies is a group of facies among the first set of groups of facies, for each current virgin mesh cell neighbouring the set of connected mesh cells, determining a second group of facies among groups of facies of the first set of groups of facies and of the second set of groups of facies as a function of the local values of proportion of the groups of facies for said current virgin mesh cell and if the second determined group of facies corresponds to the first group of facies, an identification of said current virgin mesh cell as a candidate mesh cell; and
a circuit for, if said first group of facies is a group of facies among the second set of groups of facies, for each current virgin mesh cell neighbouring mesh cells associated with a group of facies, determining a determination second group of facies among groups of facies of the first set of groups of facies and of the second set of groups of facies as a function of the local values of proportion of the groups of facies for said current virgin mesh cell and if the second determined group of facies corresponds to the first group of facies, an identification of said current virgin mesh cell as a candidate mesh cell;

a circuit for associating said first group of facies with a virgin mesh cell selected among the candidate mesh cells; and a display for representing a hydrocarbon reserve in the geological model based on said associating.

9. A non-transitory computer readable storage medium, having stored thereon a computer program comprising program instructions, the computer program being loadable into a data-processing unit and adapted to cause the data-processing unit to carry out the steps of claim 1 when the computer program is run by the data-processing device.

* * * * *